(12) United States Patent
Suzuki

(10) Patent No.: US 6,457,151 B1
(45) Date of Patent: Sep. 24, 2002

(54) WAVEFORM CONTROLLER FOR AN IC TESTER

(75) Inventor: Hiroo Suzuki, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/261,805

(22) Filed: Mar. 3, 1999

(30) Foreign Application Priority Data

Mar. 3, 1998 (JP) ............................................ 10-050843

(51) Int. Cl.[7] .......................... H04B 17/00; G06F 11/00
(52) U.S. Cl. ...................................... 714/726; 714/724
(58) Field of Search ................................. 714/726, 724, 714/700

(56) References Cited

U.S. PATENT DOCUMENTS

| | | | | |
|---|---|---|---|---|
| 4,497,056 A | * | 1/1985 | Sugamori | 714/736 |
| 5,291,449 A | * | 3/1994 | Dehara | 365/200 |
| 5,590,137 A | * | 12/1996 | Yamashita | 714/738 |
| 5,978,949 A | * | 11/1999 | Terayama | 714/738 |

* cited by examiner

*Primary Examiner*—Phung M. Chung
(74) *Attorney, Agent, or Firm*—Knobbe, Martens, Olson & Bear, LLP

(57) ABSTRACT

A waveform controller for an IC tester includes selectors and OR circuits for incorporating an edge of a strobe signal into a driver signal system and allows the use of the edge of the strobe signal as a driver signal edge for driver pins.

25 Claims, 3 Drawing Sheets

(a)

(b)

(a)

(b)

WAVEFORM CONTROLLER FOR AN IC TESTER

BACKGROUND OF THE INVENTION

1. Field of the Invention

The present invention relates to a waveform controller for generating various waveforms for an IC tester.

2. Description of the Related Art

Explanation is presented with reference to the figures regarding the prior art.

Explanation is first presented regarding an embodiment of a semiconductor IC tester described in Japanese Patent Laid-open No. 110357/95 as an example of a prior-art waveform controller for an IC tester.

FIG. 1 is a circuit diagram showing the construction of the prior art, and FIG. 2 is a chart showing the waveform generated by the prior art.

The three edge signals T1-T3 are each outputted at times corresponding to a desired timing edge by a timing generator (not shown). A control signal transmitted from waveform memory (not shown) is supplied to another terminal of AND gate 12 not shown in the figure. The various waveforms for an IC tester are produced by the time settings of signals T1-T3 and the content of waveform memory. Here, waveform memory stores waveform data for forming waveforms.

Signals T1-T3 pass through skew variable regulators $11_1$-$11_3$, respectively, and are inputted to AND gates 12S and 12R. The output from the AND gates 12S are transmitted to OR gate 14S through a respective skew regulator 13S. The output from the AND gates 12R are similarly transmitted to OR gate 14R through skew regulators 13R. A set signal is outputted from OR gate 14S, and a reset signal is outputted from OR gate 14R.

Signal T3 is also outputted as signal DREL through skew variable regulator $11_3$, AND gate $12_3$, and skew regulator $13_3$. Signal T4 is outputted as signal DRET through skew variable regulator $11_4$, AND gate $12_4$, and skew regulator $13_4$. Signals T5 and T6 are both used as strobe signals.

In a per-pin tester of the prior art, since waveforms are generated to output three edge signals for set signals and three edge signals for reset signals in each cycle as shown in FIG. 2, as for SBC (Surrounded by Complement) waveforms to a driver, three edge signals T1-T3 of FIG. 1 are split into two to obtain each set and reset signals. As a result, two systems of skew regulators must be provided for one edge signal.

SUMMARY OF THE INVENTION

In view of the problem of the prior art, it is an object of the present invention to provide a waveform controller for an IC tester with the purpose of decreasing the number of skew regulators to half or fewer than the number used in the prior art and thus reducing both circuit scale and power consumption.

As a solution to the above-described problem, the present invention provides a waveform controller for an IC tester that includes selectors and OR circuits for inserting strobe-signal edge signals into the driver signal system, and thus allows an edge signal for strobes to be used as a driver signal edge for driver pins.

The present invention allows the number of provided skew regulators to be reduced to half the number or fewer than are used in the prior art by using strobe-signal edge signals as driver waveform edges when using for pins dedicated to the driver, and the invention therefore has the effect of reducing both circuit scale and power consumption.

The above and other objects, features, and advantages of the present invention will become apparent from the following description based on the accompanying drawings which illustrate examples of the present invention.

DETAILED DESCRIPTION OF THE PREFERRED EMBODIMENTS

Explanation is next presented regarding embodiments of the present invention with reference to the accompanying figures.

Figure 4:
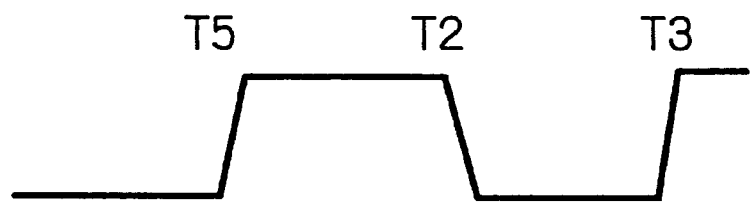
FIG. 4 is a chart showing the waveforms generated by the embodiment of the present invention.
Figure 4:
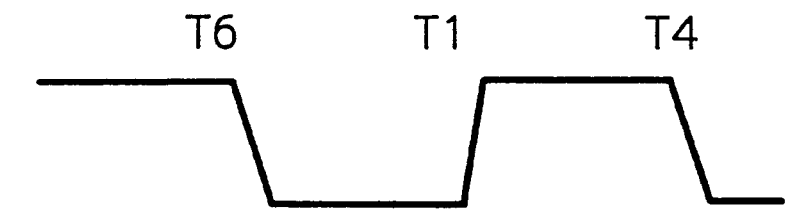
Figure 3:
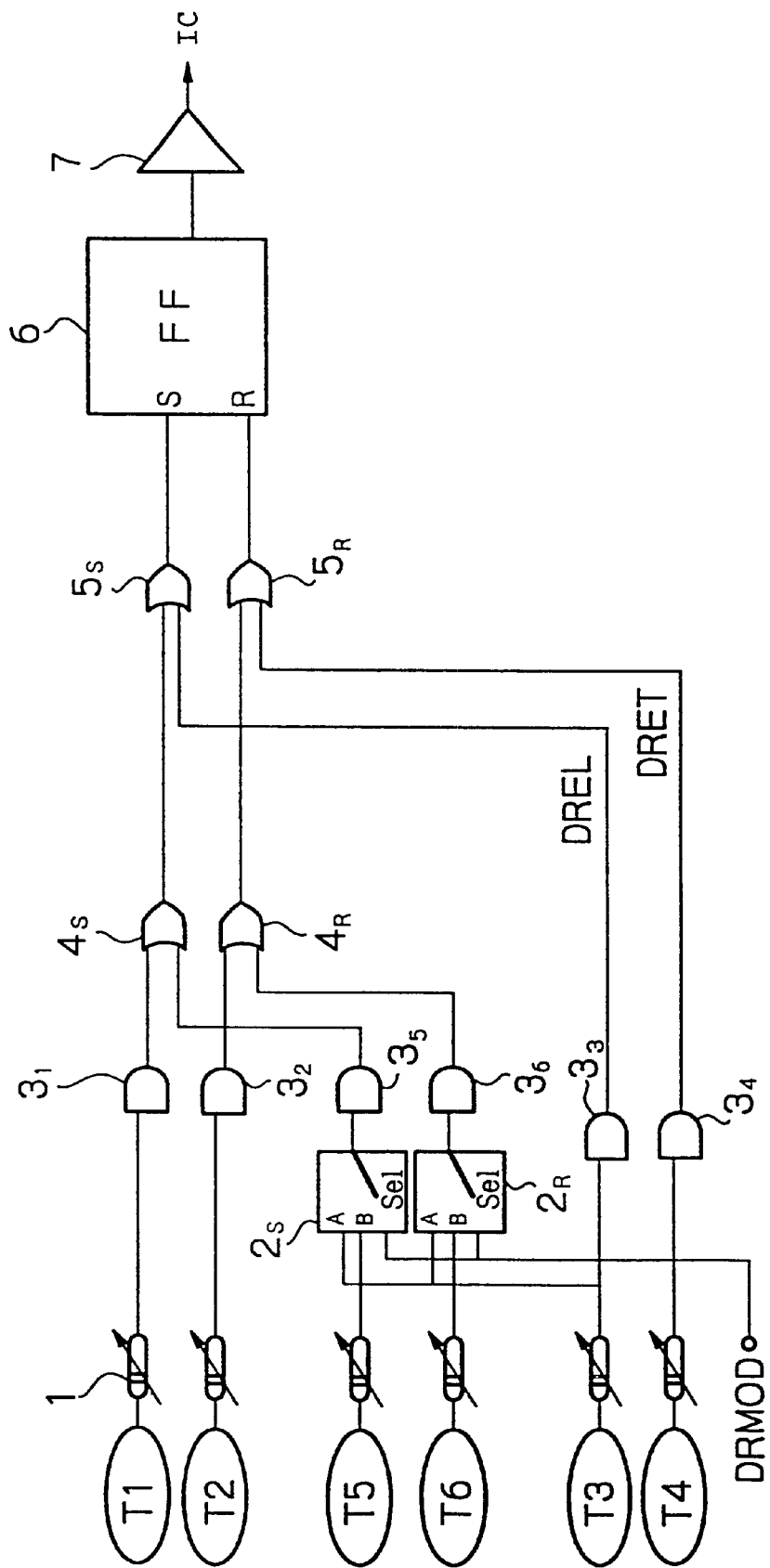
FIG. 3 is a circuit diagram showing the construction of an embodiment of the present invention.

FIG. 3 is a circuit diagram showing the construction of an embodiment of the present invention, and FIG. 4 is a chart showing the waveforms generated by the embodiment.

Figure 1:
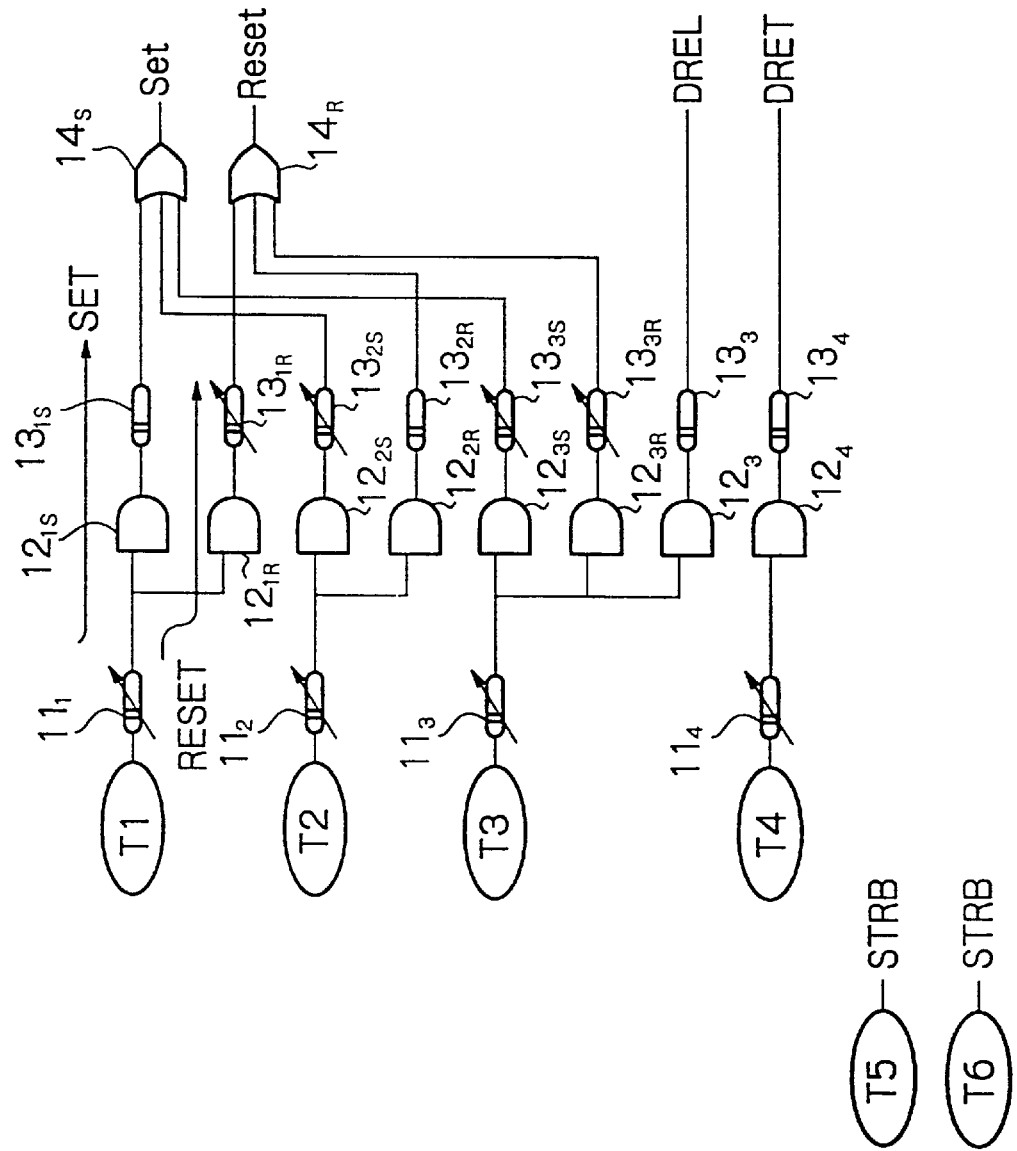
FIG. 1 is a circuit diagram showing the construction of the prior art.
Figure 2:
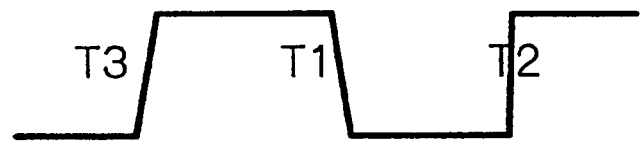
FIG. 2 is a chart showing the waveforms generated by the prior art.
Figure 2:
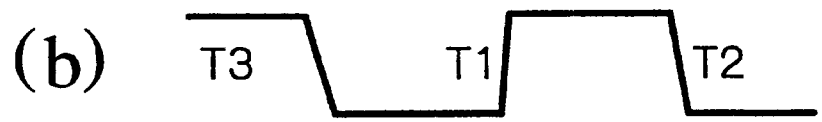

In the prior art, only three edge signals T1-T3 were used as SBC waveform outputs to driver pins. Edge signals for the comparator strobe (Signals T5 and T6 in FIG. 1) were therefore not used in the SBC waveform to driver pins.

In this embodiment of the present invention, six edge signals T1-T6 are used for driver pins by using selectors 2 and OR gates 4 as shown in FIG. 3 to insert signals T5 and T6 into the set and reset system.

The six signals T1-T6 are each outputted by a timing generator (not shown) at timings that correspond to the desired edge signals. A control signal transmitted from waveform memory (not shown in the figure) is supplied to another terminal of AND gate 3 not shown in the figure. Each of the waveforms for IC tester use are then produced by the timing settings of signals T1-T6 and the content of waveform memory.

Signals T1-T4 are inputted to AND gates $3_1$-$3_4$ through skew variable regulator $1_1$-$1_4$, respectively, and signals T3 and T5-T6 are input to AND gates $3_5$ and $3_6$ through skew variable regulators $1_3$ and $1_5$-$1_6$ and selectors 2S and 2R. Specifically, selector 2S switches between and selects either signal T3 or signal T5, and selector 2R switches between and selects either signal T3 or signal T6, and selector 2R switches between and selects either signal T3 or signal T6 in accordance with signal DRMOD that is set to driver-dedicated pins that do not use a strobe. Selector 2S then outputs to AND gate $3_5$, and selector 2R outputs to AND gate $3_6$.

OR gate 4S sets either signal T1 from AND gate $3_1$ or signal T5 from AND gate $3_5$ as the set signal and outputs the selected signal, and OR gate 5S sets one of signal T1, signal T5, and signal T3 from AND gate $3_3$ as set signal and outputs the selected signal. OR gate 4R similarly sets either signal T2 from AND gate $3_2$ or signal T6 from AND gate $3_6$ as a reset signal and outputs the selected signal, and OR gate 5R sets one of signal T2, signal T6, and signal T4 from AND gate $3_4$ as reset signal and outputs the selected signal.

The output signals of OR gate 5R and OR gate 5S are respectively inputted to the reset (R) and set (S) terminals of Set/Reset-flip-flop 6 provided in the following section, and further, are impressed through driver 7 to each driver pin of the IC element under test as the test waveform shown in FIG. 4.

Since each of outputted edge signals T1-T6 can be used fixed as a set signal or reset signal, the skew regulators for one edge signal can be reduced to just one system, and two systems of skew regulators, i.e., one for set signals and the other for reset signals, need not be provided for one edge signal as in the prior art.

While a preferred embodiment of the present invention has been described using specific terms, such description is for illustrative purposes only, and it is to be understood that changes and variations may be made without departing from the spirit or scope of the following claims.

What is claimed is:

1. A waveform controller for an IC tester comprising:
   a first selector for switch-selecting between a strobe signal and a third timing signal;
   a first OR gate that receives as input the output signal of said first selector and a first timing signal;
   a second selector for switch-selecting between another strobe signal and said third timing signal;
   a second OR gate that receives as input the output signal of said second selector and a second timing signal;
   a third OR gate that receives as input said third timing signal and the output signal of said first OR gate
   a fourth OR gate that receives as input a fourth timing signal and the output signal of said second OR gate; and
   a flip-flop that receives as set and reset input the output signals of said third and fourth OR gates and outputs them to a driver.

2. A waveform controller for an IC tester, comprising:
   a driver signal system receiving edges of a plurality of strobe signals, each strobe signal edge being generated at a time that corresponds to a desired timing edge;
   a plurality of drivers receivably connected to the driver signal system; and
   a waveform memory for controlling the strobe signal edges such that the strobe signal edges are input to the drivers.

3. The waveform controller of claim 2, wherein the driver signal system comprises selectors receiving the strobe signals and a plurality of timing signals.

4. The waveform controller of claim 3, wherein the selectors are multiplexors.

5. The waveform controller of claim 2, wherein the driver signal system includes a plurality of skew variable regulators receiving the strobe signal edges.

6. The waveform controller of claim 2, further comprising a flip-flop whose output is the output of said driver signal system.

7. A waveform controller for an IC tester, comprising:
   circuitry receiving strobe signals edges and timing signals and including skew adjusters;
   a plurality of drivers to receive selected ones of the strobe signals and timing signals; and
   a waveform memory, wherein the waveform memory controls which strobe signal edges are input to the drivers 8. A waveform controller for an IC tester, comprising:
   a driver signal circuit receiving a plurality of strobe signals edges;
   a plurality of drivers receivably connected to the driver signal circuit wherein the strobe signal edges are inputs to the drivers;
   a waveform memory, wherein the waveform memory controls which strobe signal edges are input to the drivers; and
   a plurality of AND gates, wherein one input to the AND gates is a strobe signal, and wherein another input to the AND gate is from the waveform memory.

9. The waveform controller of claim 8, wherein the driver signal circuit comprises:
   a plurality of selectors receiving the strobe signal edges;
   a plurality of OR gates receivably connected to the outputs of the AND gates; and
   at least one flip-flop receivably connected to the outputs of the OR gates.

10. A waveform controller for an IC tester, comprising:
    a plurality of selectors for receiving a plurality of strobe signals and at least one of a first plurality of timing signals; and
    a first plurality of logic circuits responsive to a second plurality of timing signals and outputs from the selectors for producing a driving signal having edges of the strobe signals, so that the driving signal is applied to driver pins of an IC under test.

11. The waveform controller of claim 10, wherein the first plurality of logic circuits comprise OR gates.

12. The waveform controller of claim 10, further comprising a second plurality of logic gates for receiving the first plurality of timing signals and outputs from the first plurality of logic circuits.

13. The waveform controller of claim 12, wherein the second plurality of logic circuits comprise OR gates.

14. The waveform controller of claim 12, further comprising a flip-flop for receiving outputs from the second plurality of logic gates.

15. The waveform controller of claim 14, wherein the flip-flop comprises an SR-type flip-flop.

16. The waveform controller of claim 12, further comprising a fifth plurality of logic circuits responsive to the first plurality of timing signals for applying outputs thereof to the second plurality of logic circuits, wherein one of the inputs to each of the fifth plurality of logic circuits is from a waveform memory.

17. The waveform controller of claim 16, wherein the fifth plurality of logic circuits comprise AND gates.

18. The waveform controller of claim 17, wherein the waveform memory input to the AND gates is used to control which strobe signal edges are used as driver signal edges to the driver pins.

19. The waveform controller of claim 12, further comprising skew variable regulators receiving the strobe signal edges.

20. The waveform controller of claim 19, wherein there are six strobe signal edges through the skew variable regulators.

21. The waveform controller of claim 10, further comprising a third plurality of logic circuits responsive to the outputs from the selectors for applying outputs thereof to the first plurality of logic circuits, and a fourth plurality of logic circuits responsive to the second plurality of timing signals for applying outputs thereof to the first plurality of logic circuits, wherein one of the inputs to each of the third and fourth logic circuits is from a waveform memory.

22. The waveform controller of claim 21, wherein at least one of the third and fourth plurality of logic circuits comprise AND gates.

23. The waveform controller of claim 22, wherein the waveform memory input to the AND gates is used to control which strobe signal edges are used as driver signal edges to the driver pins.

24. The waveform controller of claim 10, wherein the selectors comprise multiplexors.

25. The waveform controller of claim 10, further comprising skew variable regulators receiving the strobe signal edges.

* * * * *